(12) United States Patent
Chen et al.

(10) Patent No.: US 6,560,862 B1
(45) Date of Patent: May 13, 2003

(54) MODIFIED PAD FOR COPPER/LOW-K

(75) Inventors: Sheng-Hsiung Chen, Taichung (TW); Shun Long Chen, Hsin-chiu (TW); Hungtse Lin, Nan-Tou (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 96 days.

(21) Appl. No.: 09/777,302

(22) Filed: Feb. 6, 2001

(51) Int. Cl.[7] ............................................. H01R 9/00

(52) U.S. Cl. ............................... 29/843; 257/784

(58) Field of Search ........................ 29/843, 842, 846, 29/850; 257/750, 751, 758, 759, 760, 765, 771, 772, 784

(56) References Cited

U.S. PATENT DOCUMENTS

| | | | |
|---|---|---|---|
| 5,523,626 A | * | 6/1996 | Hayashi et al. ............ 257/758 |
| 5,783,868 A | | 7/1998 | Galloway .................... 257/784 |
| 5,874,356 A | | 2/1999 | Chen et al. .................. 438/637 |
| 5,923,088 A | | 7/1999 | Shiue et al. ................. 257/758 |
| 5,942,800 A | | 8/1999 | Yiu et al. .................... 257/754 |
| 6,016,000 A | * | 1/2000 | Moslehi ....................... 257/522 |
| 6,025,277 A | | 2/2000 | Chen et al. .................. 438/738 |
| 6,028,367 A | | 2/2000 | Yu ............................... 257/780 |

* cited by examiner

Primary Examiner—Gregory L. Huson
Assistant Examiner—Peter deVore
(74) Attorney, Agent, or Firm—George O. Saile; Stephen B. Ackerman; Stephen G. Stanton

(57) ABSTRACT

A method to fabricate a bonding pad structure including the following steps. A substrate having a top metal layer and a passivation layer overlying the top metal layer is provided. The top metal layer being electrically connected to a lower metal layer by at least one metal via within a metal via area. The substrate includes a low-k dielectric layer at least between the lower metal layer and the top metal layer. The passivation layer is etched within the metal via area to form a trench exposing at least a portion of the top metal layer. A patterned, extended bonding pad is formed over the etched passivation layer and lining the trench. The extended bonding pad having a portion that extends over a peripheral planar area of the substrate adjacent the trench not within the metal via area. A wire bond is bonded to the extended bonding pad at the peripheral planar area portion to form the bonding pad structure.

16 Claims, 3 Drawing Sheets

MODIFIED PAD FOR COPPER/LOW-K

FIELD OF THE INVENTION

The present invention relates generally to semiconductor devices and more specifically to methods of fabricating improved bonding pads.

BACKGROUND OF THE INVENTION

Low-k materials have poor mechanical strength and cause serious concerns in conjunction with wire bonding to wire bonding pads. Also, the low-k material exhibits some problems of low adhesion and bad heat transport. These problems are most significant on the top, or upper wire bonding pad, which is susceptible to the highest stress during wire bonding compared to lower, or underlying layers.

U.S. Pat. No. 5,783,868 to Galloway describes the fabrication and use of a bonding pad extension for the purposes of burn-in testing. The extension is used only for connections during such testing and is preferably formed to be easily removed after the burn-in testing.

U.S. Pat. No. 6,028,367 to Yu describes a bond pad structure equipped with a heat dissipating ring surrounding the pad and a method to fabricate the structure.

U.S. Pat. No. 5,942,800 to Yiu et al. describes a chessboard patterned bond pad structure with stress buffered characteristics and a method to fabricate the structure.

U.S Pat. No. 5,923,088 to Shiue et al. describes a bond pad structure with plugs underneath to prevent peeling and a method to fabricate the structure.

U.S. Pat. No. 5,874,356 to Chen et al. describes a method for forming a zig-zag bordered opening in a semiconductor structure such that the film stress in a barrier/glue layer of TiN is reduced to eliminate volcano defects that cause delamination or peeling-off of the TiN layer.

U.S. Pat. No. 6,025,277 to Chen et al. describes a bond pad structure where a hole is etched that is wider in an lower, first insulating layer than in an upper, second insulating layer.

SUMMARY OF THE INVENTION

Accordingly, it is an object of the present invention to provide a bonding pad structure having a wire bond affixed to a planar dielectric area having a stronger mechanical strength, and a method to fabricate same.

Another object of the present invention is to provide a method to fabricate a bonding pad structure having a wire bond affixed to a planar dielectric area without causing dielectric cracking or peeling, and a method to fabricate same.

Other objects will appear hereinafter.

It has now been discovered that the above and other objects of the present invention may be accomplished in the following manner. Specifically, a substrate having a top metal layer and a passivation layer overlying the top metal layer is provided. The top metal layer being electrically connected to a lower metal layer by at least one metal via within a metal via area. The substrate includes a low-k dielectric layer at least between the lower metal layer and the top metal layer. The passivation layer is etched within the metal via area to form a trench exposing at least a portion of the top metal layer. A patterned, extended bonding pad is formed over the etched passivation layer and lining the trench. The extended bonding pad having a portion that extends over a peripheral planar area of the substrate adjacent the trench not within the metal via area. A wire bond is bonded to the extended bonding pad at the peripheral planar area portion to form the bonding pad structure.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, steps, methods, etc. may be formed or accomplished by conventional steps or methods known in the prior art.

Problem Discovered by the Inventors

The inventors discovered that when a metal bonding pad comprised of, for example copper (Cu), was formed over an underlying low-k material layer, and a wire was bonded to the copper bonding pad, there was a relatively high probability that either the copper wire bonding pad,either peeled apart from the low-k material and/or the low-k material cracked. In either situation, the chip may fail and the failure site was found most often on the low-k material/metal bonding pad interface. Poor mechanical strength and poor adhesion of the low-k material to either SiN or Cu was determined to be the root cause.

The inventors studied wire bond failures on SiLK (low-k) packaging samples and identified the root cause as failure of the low-k/copper interface at the bottom of the metal vias.

Preferred Embodiment of the Present Invention

Summary of the Present Invention

The inventors have discovered that by extending the pad area (bonding pad) to the peripheral planar area that does not have the metal via underneath has increased mechanical strength, and affixing the wire bond to that peripheral planar area, low-k dielectric layer cracking and/or peeling of the bonding pad from the low-k dielectric layer is eliminated.

Initial Structure

Figure 1:
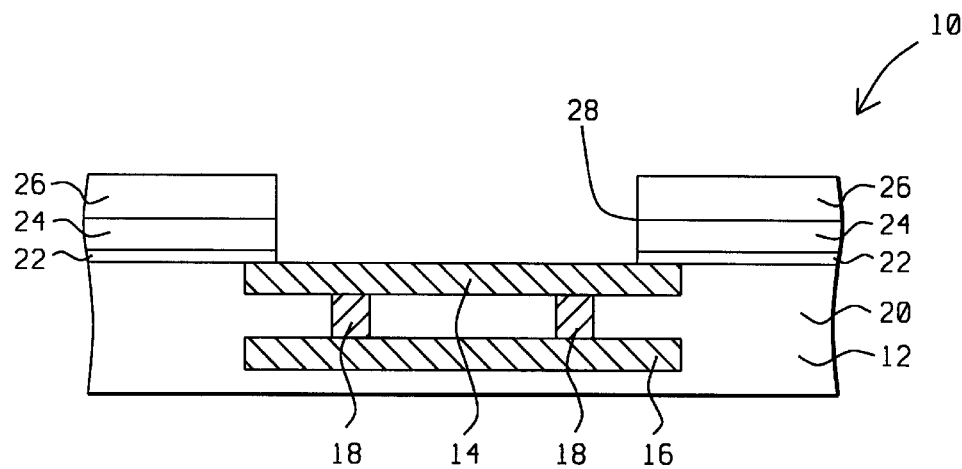
FIGS. 1 to 4 illustrate a preferred embodiment of the present invention.

FIG. 1 is a simplified illustration of structure 10 including substrate or die 12 with a top metal layer 14 that is preferably comprised of copper (Cu). Top Cu layer 14 is electrically connected to lower metal layer 16, for example, by metal vias 18. Substrate/die 12 includes low-k dielectric, or inter-metal dielectric (IMD), layer 20 between lower metal layer 16 and top Cu layer 14, and surrounding metal vias 18.

Etch stop layer 22 overlies substrate/die 12 and is preferably comprised of either SiON or $Si_3N_4$ (SiN). $SiO_2$ (oxide) layer 24 overlies etch stop layer 22 and is preferably from about 3800 to 4200 Å thick, and is more preferably about 4000 Å thick. Passivation layer 26 overlies oxide layer 24, is preferably comprised of SiN and is preferably from about 6600 to 7400 Å thick, and is more preferably about 7000 Å thick.

Passivation Layer 26 Etch

SiN passivation layer 26, oxide layer 24, and etch stop layer 22 are then etched to form bonding pad trench 28.

Formation of Barrier Layer 30 and Bond Pad Metal Layer 32

Figure 2:
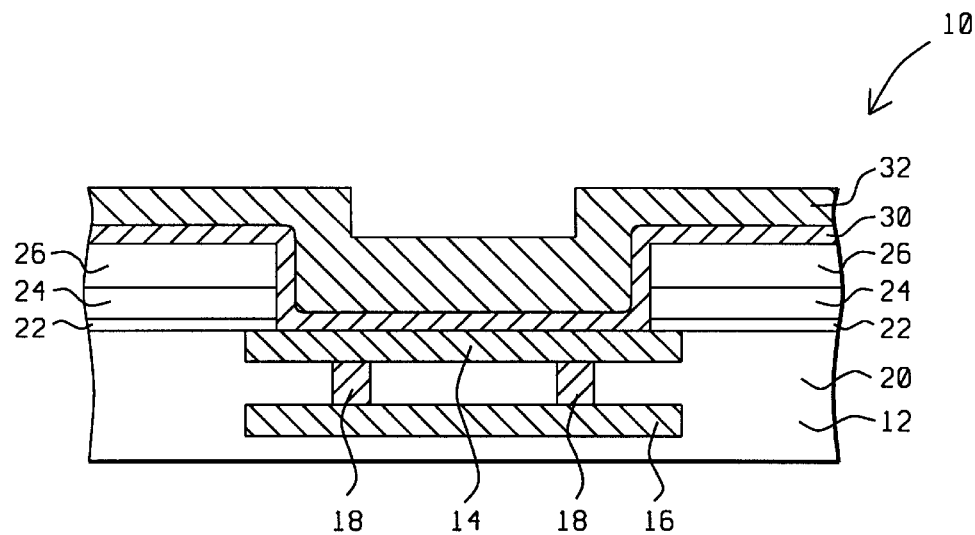

As shown in FIG. 2, barrier layer 30 is formed over the etched SiN passivation layer 26, lining bonding pad trench 28. Barrier layer 30 is preferably comprised of titanium nitride (TiN).

Metal bonding pad layer 32 is then formed over TiN barrier layer 30. Metal bonding pad layer 32 is preferably formed of an aluminum copper alloy (AlCu).

Formation of Patterned Masking Layer 34 Over AlCu Bonding Pad Layer 32

Figure 3:
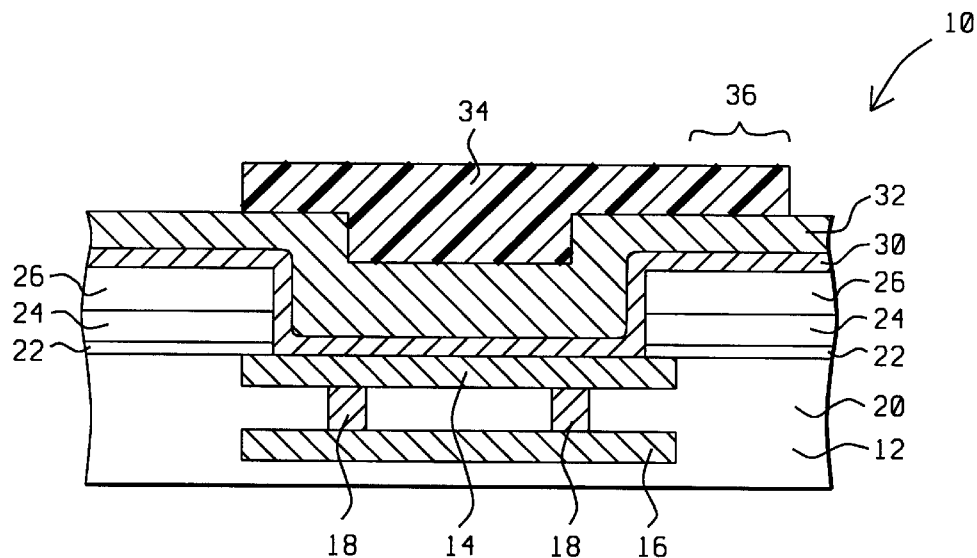

As shown in FIG. 3, patterned masking layer 34 is formed over AlCu bonding pad layer 34 (and TiN barrier layer 30) to additionally mask a portion of AlCu bonding pad layer 34 that overlies a peripheral planar area 36 over substrate/die 12 that does not have the metal vias 18 thereunder.

Masking layer 34 may be comprised of, for example, photoresist as shown in FIG. 3.

Patterning of Metal Bonding Pad Layer 32 to Form Extended Bonding Pad 32'

Figure 4:
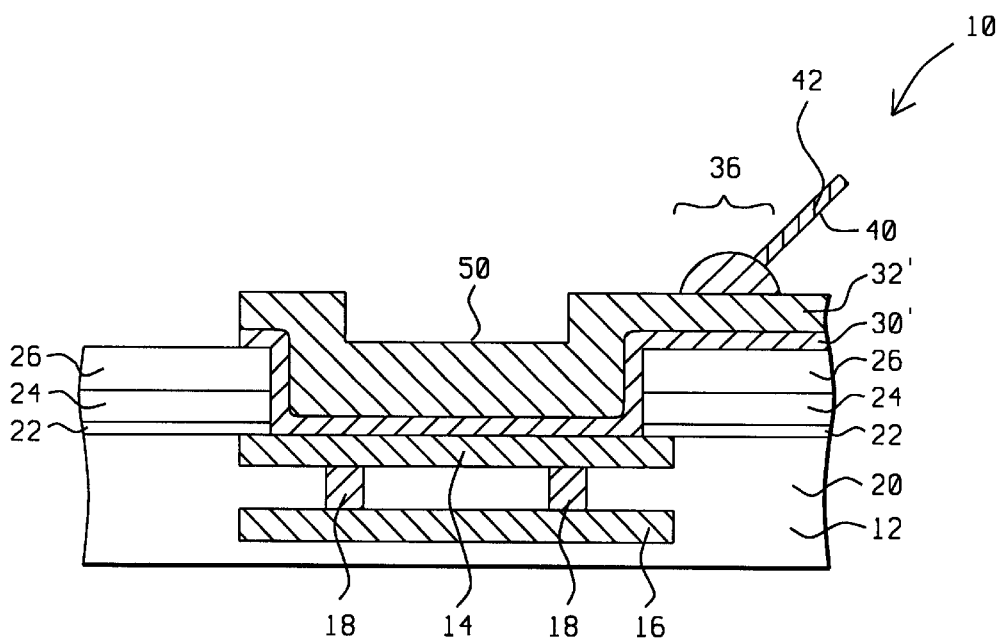

As shown in FIG. 4, in a key step of the invention, AlCu bonding pad layer 32 and TiN barrier layer 30 are etched, using patterned masking layer 34 as a mask, to form extended, permanent, AlCu bonding pad 32' with underlying extended, permanent, TiN barrier layer 30'. Extended AlCu bonding pad 32', with underlying extended TiN barrier layer 30', extend over peripheral planar area 36 of substrate/die 12 that does not have the metal vias 18 thereunder.

Patterned masking layer 34 is then removed and the structure 10 may be cleaned and tested, as necessary.

Attachment of Wire Bond 40 to Extended AlCu Bonding Pad 32'

Wire bond 40, including wire 42 that is preferably comprised of gold (Au), is permanently attached/affixed to extended AlCu bonding pad 32' at peripheral planar area 36 over substrate/die 12 that does not have the metal vias 18 thereunder. The inventors have determined that such a wire bond 40 arrangement does not cause cracking of low-k dielectric layer 20, or peeling of: (1) AlCu bonding pad 32' with underlying extended TiN barrier layer 30'; and/or (2) SiON/SiN etch stop layer 22 from low-k dielectric layer 20. In the conventional pad structure, the wire bonding will fail at the via bottom (18) due to low mechanical properties and bad heat transport.

It is noted that a conventional bonding pad structure would not include permanent extended AlCu bonding pad 32' over peripheral planar area 36, and would instead affix wire bond 40 to portion 50 of non-extended AlCu bonding pad over metal vias 18. As noted above, the inventors have determined that such a conventional bonding pad structure is highly susceptible to cracking of the low-k dielectric layer, and/or peeling of: the bonding pad; and/or the etch stop layer from the low-k dielectric layer.

Ball Shear Improvement

Figure 5A:
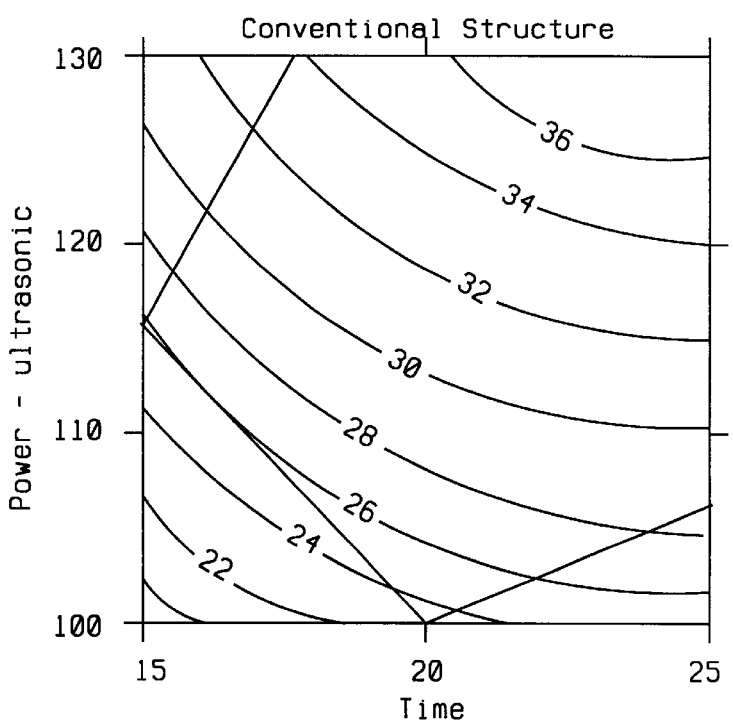
FIG. 5A is a graph illustrating ball shear ($mg/cm^2$) for a conventional bonding pad structure.
Figure 5B:
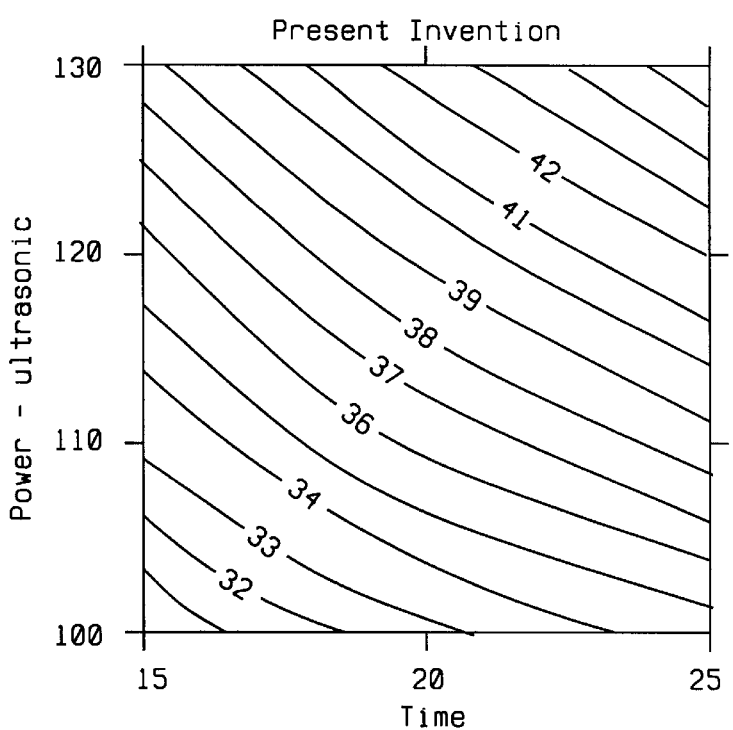
FIG. 5B is a graph illustrating ball shear ($mg/cm^2$) for a bonding pad structure fabricated in accordance with-a preferred embodiment of the present invention.

As illustrated in FIGS. 5A and 5B(, the ball shear for the bonding pad structure fabricated in accordance with the present invention (FIG. 5B) is improved from the ball shear for a conventional bonding pad structure (FIG. 5A). That is, the conventional bonding pad structure has a wire bond shear of about 22 mg/cm$^2$ while the wire bond 40 shear for the bonding pad structure of FIG. 4 made in accordance with the method of the present invention has a ball shear of greater than about 30 mg/cm$^2$.

Advantages of the Present Invention

The advantages of the present invention include:
1) the wire bond ball shear is increased;
2) cracking of the low-k dielectric layer is eliminated;
3) peeling of the bonding pad from the low-k dielectric layer is eliminated;
4) peeling of the SiON/SiN etch stop layer from the low-k dielectric layer is eliminated; and
5) to improve the copper/low-k wire bond reliability characteristics.

While particular embodiments of the present invention have been illustrated and described, it is not intended to limit the invention, except as defined by the following claims.

We claim:
1. A method to fabricate a bonding pad structure including the steps of:
   providing a substrate having a top metal layer and a passivation layer overlying the top metal layer; the top metal layer being electrically connected to a lower metal layer by at least one metal via within a metal via area; substrate including a low-k dielectric layer at least between the lower metal layer and the top metal layer;
   etching the passivation layer within the metal via area to form a trench exposing at least a portion of the top metal layer;
   forming a patterned, extended bonding pad over the etched passivation layer and lining the trench; the extended bonding pad having a portion that extends over a peripheral planar area of the substrate adjacent the trench not within the metal via area;
   bonding a wire bond to the extended bonding pad at the peripheral planar area portion to form the bonding pad structure.
2. The method of claim 1, wherein the top metal layer is comprised of copper; the passivation layer is comprised of SiN; the extended bonding pad is comprised of an AlCu alloy; and the wire bond includes a gold wire.
3. The method of claim 1, wherein the passivation layer is from about 6600 to 7400 Å thick.
4. The method of claim 1, wherein the top metal layer has an etch stop layer formed thereover, an oxide layer is formed over the etch stop layer, and the passivation layer is formed over the oxide layer.
5. The method of claim 1, wherein the top metal layer has an etch stop layer formed thereover, an oxide layer is formed over the etch stop layer, and the passivation layer is formed over the oxide layer; the top metal layer being comprised of copper, the etch stop layer being comprised of a material selected from the group consisting of SiON and Si$_3$N$_4$, and the passivation layer being comprised of Si$_3$N$_4$.
6. The method of claim 1, wherein the top metal layer has an etch stop layer formed thereover, an oxide layer having a thickness of from about 3800 to 4200 Å is formed over the etch stop layer, and the passivation layer having a thickness of from about 6600 to 7400 Å is formed over the oxide layer.

7. A method to fabricate a bonding pad structure including the steps of:
  providing a substrate having a top metal layer; the top metal layer being electrically connected to a lower metal layer by at least one metal via within a metal via area; substrate including a low-k dielectric layer at least between the lower metal layer and the top metal layer;
  forming an etch stop layer over the low-k dielectric layer and the top metal layer;
  forming an oxide layer over the etch stop layer;
  forming a passivation layer overlying the oxide layer;
  etching the passivation layer, the oxide layer, and the etch stop layer within the metal via area to form a trench exposing at least a portion of the top metal layer;
  forming a patterned, extended bonding pad with an underlying barrier layer, over the etched passivation layer and lining the trench; the extended bonding pad with underlying barrier layer each having a portion that extends over a peripheral planar area of the substrate adjacent the trench not within the metal via area;
  bonding a wire bond to the extended bonding pad at the peripheral planar area portion to form the bonding pad structure.

8. The method of claim 7, wherein the top metal layer is comprised of copper; the etch stop layer is comprised of a material selected from the group consisting of SiON and $Si_3N_4$, the passivation layer is comprised of SiN; the extended bonding pad is comprised of an AlCu alloy; and the wire bond includes a gold wire.

9. The method of claim 7, wherein the oxide layer is from about 3800 to 4200 Å thick, and the passivation layer is from about 6600 to 7400 Å thick.

10. The method of claim 7, wherein the oxide layer is about 4000 Å thick, and the passivation layer is about 7000 Å thick.

11. In a bonding pad structure having a substrate with a top metal layer exposed through an etched, trenched passivation layer overlying the substrate; the top metal layer being electrically connected to a lower metal layer within the substrate by at least one metal via within a metal via area; and a bonding pad formed over the exposed top metal layer and at least a portion of the etched passivation layer; the improvement comprising:
  the bonding pad being extended over a peripheral planar area of the substrate adjacent the trench formed within the passivation layer that is not within the metal via area; and
  a wire bond bonded to the extended bonding pad at the peripheral planar area portion.

12. The structure of claim 11, wherein the top metal layer is comprised of copper; the passivation layer is comprised of SiN; the extended bonding pad is comprised of an AlCu alloy; and the wire bond includes a gold wire.

13. The structure of claim 11, wherein the passivation layer is from about 6600 to 7400 Å thick.

14. The structure of claim 11, wherein the top metal layer has an etch stop layer formed thereover, an oxide layer is formed over the etch stop layer, and the passivation layer is formed over the oxide layer.

15. The structure of claim 11, wherein the top metal layer has an etch stop layer formed thereover, an oxide layer is formed over the etch stop layer, and the passivation layer is formed over the oxide layer; the top metal layer being comprised of copper, the etch stop layer being comprised of a material selected from the group consisting of SiON and $Si_3N_4$, and the passivation layer being comprised of $Si_3N_4$.

16. The structure of claim 11, wherein the top metal layer has an etch stop layer formed thereover, an oxide layer having a thickness of from about 3800 to 4200 Å is formed over the etch stop layer, and the passivation layer having a thickness of from about 6600 to 7400 Å is formed over the oxide layer.

* * * * *